United States Patent
Geva et al.

(10) Patent No.: US 6,707,676 B1
(45) Date of Patent: Mar. 16, 2004

(54) HEAT SINK FOR AUTOMATIC ASSEMBLING

(76) Inventors: Ehood Geva, 4190 Maybell Way, Palo Alto, CA (US) 94306; Shmuel Erez, 3310 Olsen Dr., San Jose, CA (US) 95117

(*) Notice: Subject to any disclaimer, the term of this patent is extended or adjusted under 35 U.S.C. 154(b) by 0 days.

(21) Appl. No.: 10/231,718

(22) Filed: Aug. 30, 2002

(51) Int. Cl.[7] ................................................ H05K 7/20
(52) U.S. Cl. ...................... 361/719; 165/80.3; 165/185; 174/16.3; 257/707; 257/713; 257/722; 257/719; 361/704; 361/690; 361/703
(58) Field of Search .............................. 165/80.2, 80.3, 165/185; 174/16.3; 257/706–707, 712–713, 718–719, 722, 726–727; 361/690, 703–710, 715, 719–721

(56) References Cited

U.S. PATENT DOCUMENTS

| | | |
|---|---|---|
| 4,625,260 A | 11/1986 | Jordan et al. |
| 4,849,856 A * | 7/1989 | Funari et al. ............... 361/704 |
| 5,386,144 A | 1/1995 | Variot et al. |
| 5,667,870 A * | 9/1997 | Mccullough ................ 257/719 |
| 5,917,701 A | 6/1999 | Solberg |
| 5,930,114 A * | 7/1999 | Kuzmin et al. ............. 361/704 |
| 6,075,699 A | 6/2000 | Rife |
| 6,346,672 B1 * | 2/2002 | Horng ........................ 361/704 |

* cited by examiner

*Primary Examiner*—Gregory D Thompson

(57) ABSTRACT

The heat-sink assembly of the invention is attached to the PC board with the use of surface mount technology. The assembly comprises a base part or a base member soldered to the PC board and a top part or a heat-sink member snapped-on through the central opening of the base member by irreversibly deforming bendable lugs which may have a radial or any other suitable shape. The bottom of the heat-sink member may be pushed down to physical contact with the top of the chip or to a position that leaves a space between the bottom of the heat-sink member and the top of the chip, so that the aforementioned space may be filled with a heat-conducting medium. It is an option to use the base part only. If necessary, a second heat-sink member of the same type, which could have different dimensions, can be soldered to the PC board side opposite to the chip. The heat sinks could be used with or without a fan. In the case of the assembly with a fan, the deice may have an air-flow guiding funnel formed on side portion of the base member.

25 Claims, 4 Drawing Sheets

HEAT SINK FOR AUTOMATIC ASSEMBLING

FIELD OF THE INVENTION

The present invention relates to heat a sink for removal of heat from a heat source, in particular, from a semiconductor chip or a similar electronic or electric devices which are heated during the operation and are located in confined spaces.

BACKGROUND OF THE INVENTION

Semi-conductor chip packages, which may contain a plurality of integrated circuits combined into a compact unit, become more complex and operate at higher frequencies. As a result, during operation they generate more heat. As a rule such devices are located In confined spaces from which the heat has to be removed. However, electronic devices can normally be heated to a predetermined limit. Heating above this limit may impair performance characteristics of the device and even lead to its damage. Moreover, long-term operation in a heated state, even at temperatures below the threshold, may drastically reduce the service life of the device.

Thus, in general, the component package configuration and construction are specifically designed to allow for maximized heat dissipation. Heat spreaders and heat sinks are employed in such electronic component packages to transfer heat to a moving air stream or on to another surface.

It should also be noted that a part of the heat flows from the chip to the ground plane of the PC board through the pins and the bottom side of the case, and will be partly carried away by convection to the entire PC board. As result, the temperature of the PC board increases for the following four reasons: 1) the PC board thin copper ground plane has high heat resistance; 2) the available ground plane size of copper is limited in dense PC boards; 3) the narrow and thin traces have high heat resistance; 4) other devices on same board might generate heat too, which can heat the device to higher temperatures.

In some IC devices, small part of the heat will be dissipated to the top side of the IC, as the heat resistance between the internal die and the top case Is fairly large. In this case the base part will be the dominant one for heat dissipation.

In order to enhance the heat-dissipation effect through a heat sink, some heat sinks are provided with an air funnel for directing the flow of air through the heat sink and between the heat-dissipating fins.

In modem heat-sink assemblies, the problems associated with limitations in connection with holes in the chip support members are solved with the so-called surface-mount technique, while the problems associated with automatic assembling are solved by the use of various snapping connections.

The surface-mount technique is based on the use of soldering. Pads on the circuit board are provided with a solder mount for the heat sink or a clip holding the heat sink. A circuit component is mounted to the heat sink and the component and heat sink are mounted to the board, the heat sink being mounted to the pads to dissipate heat from the circuit component attached thereto. In some cases, the heat sink or pads are connected to a ground plane in the circuit board to additionally dissipate heat from the circuit board. Heat-exchanging contact between the heat sink and the chip can be carried out through mechanical contact or through a heat-conductive medium that fills the space between the bottom of the heat sink and the facing surface of the chip. Furthermore, the heat is dissipated from all heated surfaces through a natural convection.

An example of a heat-sink assembly based on the use of a surface mounting technique is a device described in U.S. Pat. No. 4,625,260 issued in 1986 to W. Jordan, et al. The device comprises a heat-sink support, which is soldered to a PC board and has spring-loaded clips for detachably securing a heat sink. Although this device is suitable for automatic assembling in combination with the surface-mount technique, it has spring-loaded attachment of the heat sink, which is unreliable for use under conditions of shakes and vibrations.

Heat-sink devices are not necessarily surface mounted. For example, U.S. Pat. No. 5,386,144 issued in 1995 to P. Variot et al. discloses an electronic component assembly which comprises an electronic component package, a heat sink having an outwardly projecting latching members, and spring arms on the component package for resiliently clamping the latching members to the component package. The heat sink has a body configured and arranged to bear on the electronic component and mounts a latching member extending from the body and including a shank extending from the heat sink body having a latching flange at the distal end of the shank. A disadvantage of the invention disclosed in U.S. Pat. No. 5,386,144 is that it is applicable to component packages having a very specific configuration and therefore is not universal in its use. Another disadvantage is a complicated construction of the heat-sink attachment that requires the use of springing and latching members.

U.S. Pat. No. 6,075,699 issued in 2000 to W. Rife discloses a heat sink assembly installed above an electronic component for removing heat therefrom. The assembly includes a base member with downwardly directed legs, which have snapping ends for insertion into mounting holes formed on a support that mounts the electronic component. The base member has a central threaded opening for threadably receiving a heat sink to position in which the end of the heat sink is in flush thermal communication with the electronic component while the legs are secured within their respective holes in the electronic component. The device of U.S. Pat. No. 6,075,699 is designed for removal of heat only from the chip itself and cannot be used for cooling the surrounding lead wires and other electrical connections. This is because the heat is transferred to the heat exchanger only from the chip and cannot be efficiently transferred through the snapping ends of the attachment legs. Another serious disadvantage of the aforementioned construction is that it has a limited application and is suitable only to those designs, which allow holes in a chip-supporting member, which is not always the possible. Furthermore, in case of automatic assembling, threaded connection of the heat sink with the base member will slow down the assembling operation and will make it more complicated and expensive.

An example of a heat-sink assembly which can be used only with PC boards that allow holes in their structures is a device of U.S. Pat. No. 5,917,701 issued in 1999 to T. Solberg, which discloses a vertically-arranged heat-sink support structure that consists of a lower member and an upper member. The circuit board has a plurality of openings in a mounting surface thereof. The fastener includes a body having a main portion. A spring clip extends in a first direction from the main portion into the groove and is biased to engage the first and second surfaces of the heat sink. A plurality of latches on the spring clip engages the lock recesses when the spring clip engages the first and second surfaces of the heat sink. A plurality of anchor lugs extends in a second direction from the main portion, opposite the first direction, to be received in respective openings in the board to rigidly attach the fastener to the circuit board. Preferably, the anchor lugs are of differing lengths and configurations to permit assembly of the clip to differently sized circuit boards. Also preferably, engagement protrusions on the clip engage a concave surface on the heat sink.

An advantage of the assembly of U.S. Pat. No. 5,917,701 is that it is suitable for automatic assembling. However, this assembly requires a provision of holes in the PC board. A second disadvantage is a provision of spring-loaded clips, since with the lapse of time the clips may loose their resiliency, so that conditions of heat-conducting contact can be lost. Moreover, if the entire device operates under conditions of vibrations or shocks, the upper and lower parts of the heat-sink attachment can get loose and be completely disconnected.

OBJECTS AND SUMMARY OF THE INVENTION

It is an object of the present invention to provide a heat sink device which is suitable for automatic assembling, is simple and universal in construction, inexpensive to manufacture, does not use screws, ridge other threaded connections, or clips, removes heat not only from the chip but from the chip-supporting areas of the PC board, can be installed on a PC board without the use of holes in the PC board, allows to minimize the amount of parts in a heat-sink assembly by combining the base and the funnel into an integral unit made from a single workpiece, simplifies attachment of the heat sink to the base with the use of an automatic assembly machine such as a "pick and place" machine, and improves reliability of heat-transfer contacts in a heat-transfer chain of the assembly.

The heat-sink assembly of the invention is attached to the PC board with the use of surface mount technology. The assembly comprises a base part or a base member soldered to the PC board and a top part or a heat-sink member snapped-on through the central opening of the base member by irreversibly deforming bendable lugs which may have a radial or any other suitable shape. The bottom of the heat-sink member may be pushed down to physical contact with the top of the chip or to a position that leaves a space between the bottom of the heat-sink member and the top of the chip, so that the aforementioned space may be filled with a heat-conducting medium. It is an option to use the base part only. If necessary, a second heat-sink member of the same type, which could have different dimensions, can be soldered to the PC board side opposite to the chip. The heat sinks could be used with or without a fan.

DETAILED DESCRIPTION OF THE INVENTION

Figure 1:
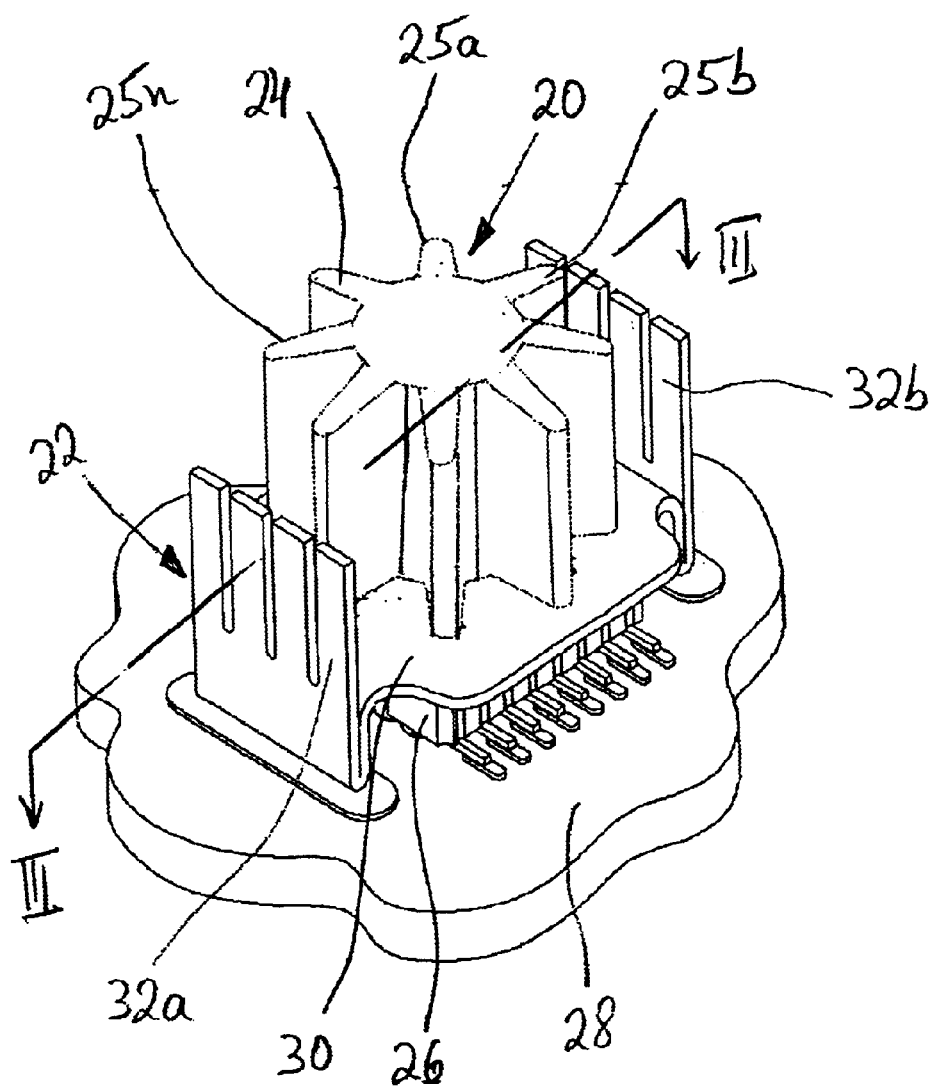
FIG. 1 is a three-dimensional view of a heat-sink assembly of the invention with vertically arranged fins of the heat sink.

FIG. 1 is a three-dimensional view of a heat-sink assembly of the invention with vertically arranged fins of the heat sink.

The entire unit, which in FIG. 1 is designated by reference numeral 20, consists of a base member 22, a main heat-sink member 24, with vertically arranged radial fins 25a, 25b, ... 25n, attached to the base member 22, and a heat source, e.g., an IC chip 26 installed on a PC board 28 under the base member 22.

The base member 22 is made out of metal capable of being soldered to the ground plane of the PC board 28 without glue, clip or screw. If additional mechanical strength is required, it could have one or more pins (not shown) to be inserted into holes (not shown) in the PC board 28. The base member 22 has a U-shaped configuration with a central part 30 which is raised and arranged parallel to the PC board 28 and two side portions 32a and 32b arranged perpendicular to the central part 30. The side portions 32a and 32b are made integrally with the central part 30, i.e., from a single piece of a sheet metal.

Figure 2:
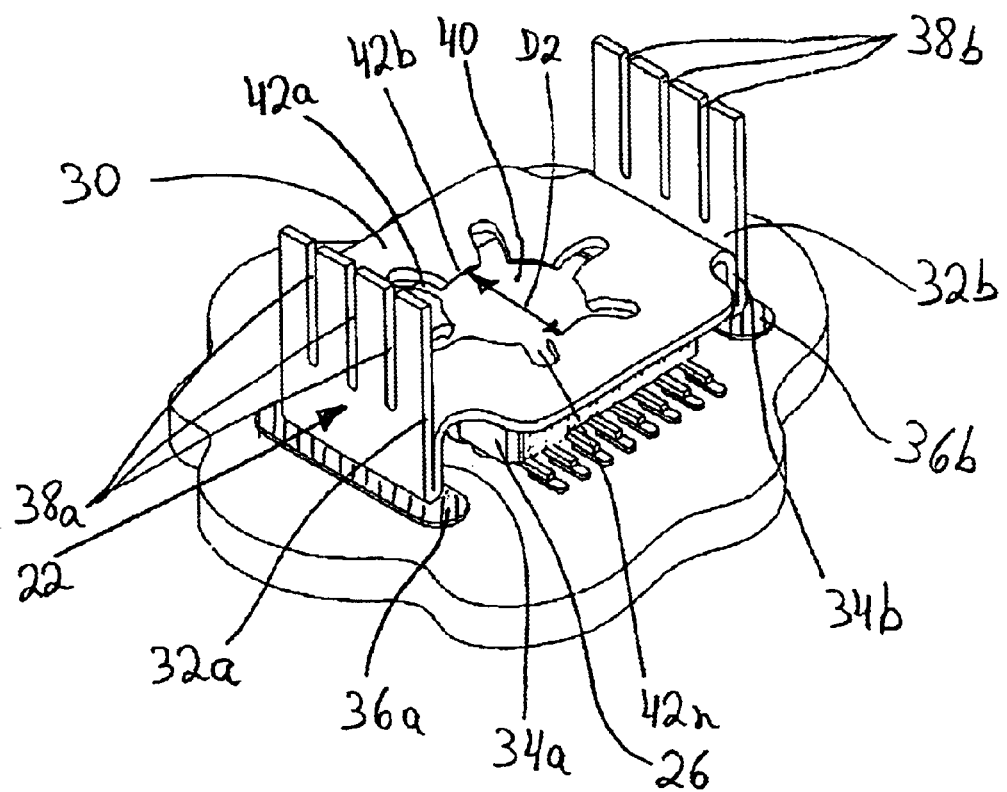
FIG. 2 is a view similar to FIG. 1 with the heat-sink member removed for illustration of a central opening with bendable lugs for attachment of the heat-sink member to the base member.

FIG. 2 is a view similar to FIG. 1 with the heat-sink member removed for illustration of a central opening with bendable lugs for attachment of the heat-sink member to the base member.

As shown in FIG. 2, in order to provide room for the IC chip 26, the central part is raised to a height H above the lower ends of the folded portions 34a and 34b of the base member 22, so that the height H from the lowest point of the bendable lugs 42a, 42b, ... 42n is greater than the thickness of the IC chip 26.

The aforementioned the lower ends of the folded portions 34a and 34b rest on soldering pads 36a and 36b, which are known in the art and are used for soldering the heat-sink member to the PC board in manner known in the art.

It can be seen from FIG. 2 that the sided portions 32a and 32b of the heat-sink member 24 are provided with additional heat-dissipating fins 38a and 38b formed on the upper or free ends of the side portions 32a and 32b. As shown in the same FIG. 2, the central part 30 of the heat-sink member 22 has an opening 40. The periphery of the opening 40 is defined by a plurality of bendable lugs 42a, 42b, ... 42n directed radially inwardly.

Figure 3:
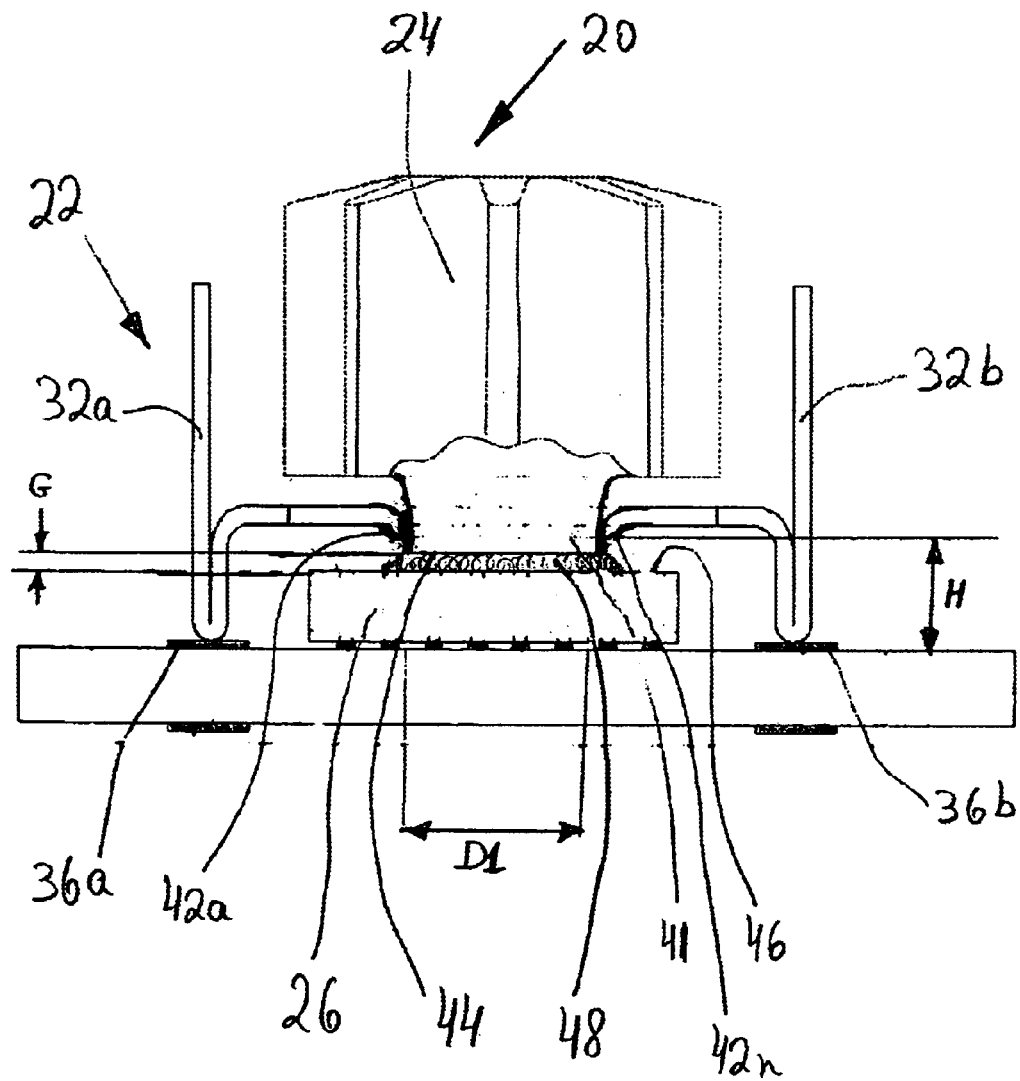
FIG. 3 is a partially-sectional side view of the heat-sink assembly along line III—III of FIG. 1.

FIG. 3 is a partially-sectional side view of the heat-sink assembly along line III—III of FIG. 1. As can be seen from FIG. 3, the heat sink member 24 has at it lower end a cylindrical projection 41 with a diameter D1 greater than the inner diameter D2 of the opening 40 (FIG. 2). In other words, diameter D1 is greater than the distance between the tips of the diametrically-opposite bendable lugs (42a and 42n shown in FIGS. 2 and 3). As a result, when in automatic assembling operation, the heat-sink member is attached to the base member 22, it is pushed towards the IC chip 26 so that the cylindrical portion 41 passes through the opening 40 and bends the radial lugs to positions shown in FIG. 3 by reference numerals 42a and 42n. The force applied from the deformed lugs to the surface of the cylindrical projection 41 will be sufficient to firmly hold the heat sink member 24 in place.

In order to provide a uniform reliable heat-exchanging contact between the lower end face 44 of the cylindrical projection 41 and the top surface 46 of the IC chip 26, the cylindrical projection 41 does not reach the top surface 46 and forms a gap G therewith. This gap is filled with a heat conductive medium 48, such as a heat-conductive glue, paste, tape, or resin, e.g., an epoxy resin. Furthermore, a provision of gap G solves does not require accurate tolerances in positioning the lower end of the heat sink relative to the IC chip 26.

Figure 4:
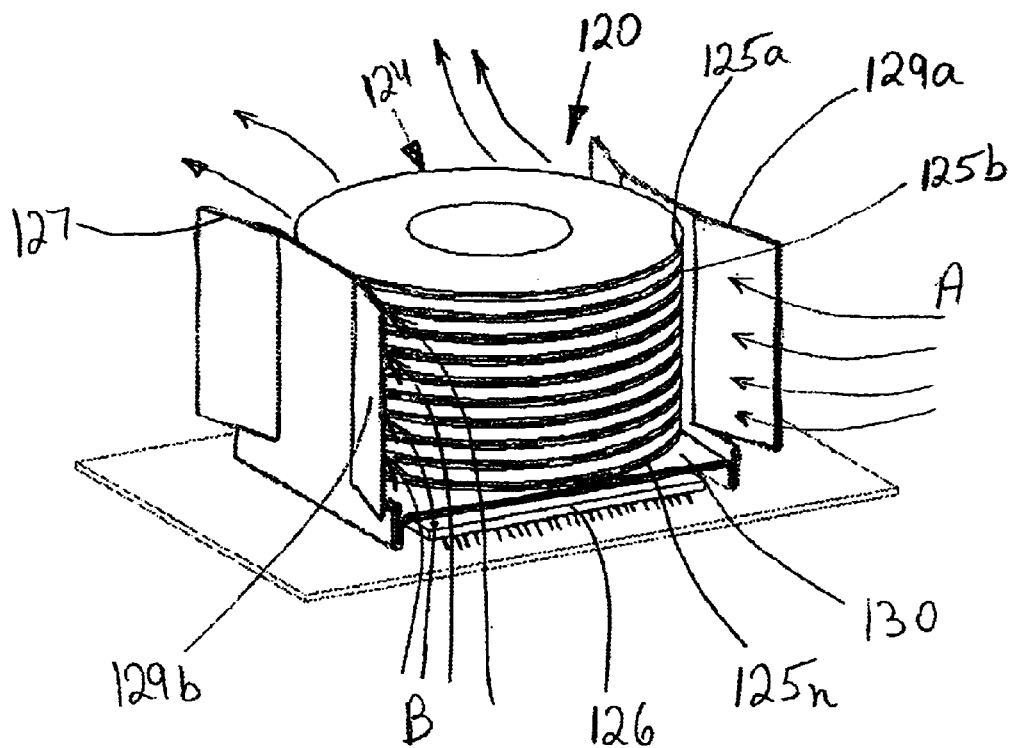
FIG. 4 is a three-dimensional view of a heat-sink assembly made in accordance with another embodiment of the invention, wherein the heat sink member is combined with an air-flow funnel.

FIG. 4 is a three-dimensional view of a heat-sink assembly made in accordance with another embodiment of the invention, wherein the heat sink member is combined with an air-flow funnel.

In general, the heat sink assembly 120 of this embodiment is similar to the one described above and differs from it by the use of a heat-sink member 124 with heat-dissipating fins 125a, 125b, . . . 125n arrange parallel to the PC board 128 and by a provision of an air-flow funnel 127, formed by two baffles 129a and 129b which form an air duct for directing the flow of cooling medium shown by arrows A and B (FIG. 4) to the heat-sink member 120 in order to pass the cooling medium between the heat-dissipating fins 125a, 125b, . . . 125n. The cooling medium may be a cooling air supplied by a fan (not shown).

Other parts and elements of the assembly of FIG. 4, i.e., the base member, the PC board, etc., are the same as in the previous embodiment and therefore their description is omitted.

Thus it has been shown that the invention provides a heat sink device which is suitable for automatic assembling, is simple and universal in construction, inexpensive to manufacture, does not use screws, other threaded connections, or clips, removes heat not only from the chip but from the chip-supporting areas of the PC board, can be installed on a PC board without the use of holes in the PC board, allows to minimize the amount of parts in a heat-sink assembly by combining the base and the funnel Into an integral unit made from a single workpiece, simplifies attachment of the heat sink to the base with the use of an automatic assembling machines such as a "pick and place" machine, and improves reliability of heat-transfer contacts in a heat-transfer chain of the assembly.

Although the invention has been described with reference to a specific embodiment, it is understood that this embodiment should not be construed as limiting the application of the invention. Therefore any changes in the shapes, materials, and constructions are possible, provided these changes do not depart from the scope of the patent claims. For example, the heat-sink assembly of the first embodiment with vertically arranged fins of the heat sink also can be provided with a funnel of the type shown in FIG. 4. The heat-sink members may be of any other shape and construction that those shown in the drawings. The end of the heat sink member may be brought Into direct physical contact with the top of the chip. The parts of the assembly can be made from various materials such as metals or can be molded from heat-conductive plastics. Soldering attachment can be combined with locking pins. Bendable lugs may have springing properties. The heat-sink member can be additionally soldered to the base. The heat-sink assembly can be used in combination with a cooling fan or without the fan.

What is claimed is:

1. A heat-sink assembly for removal of heat from a heat source with which said heat-sink assembly is maintained in a heat-exchanging contact, comprising:
   a support member for supporting, at least on one side thereof, said heat source and said heat-sink assembly;
   said heat-sink assembly comprising: a base member having heat-dissipating means and side portions for attaching said heat-sink assembly to said at least one side of said support member with use of attachment means, said base member and said side portions for attaching said heat-sink assembly being made from a single workpiece and comprise an integral part;
   said attachment means for attaching said heat-sink assembly being a solder connection of said heat-sink assembly to said support member;
   said base member having a through opening with a periphery in the area above said heat source and between said side portions, said opening having bendable members arranged on said periphery, said heat-dissipating means comprising at least a main heat sink insertable into said opening by deforming said bendable members to a bended position and installing said heat-dissipating means to a heat-exchanging position which provides said heat exchanging contact between said heat-sink assembly and said heat source, said bendable members comprising locking means for locking said heat-dissipating means in said heat-exchanging position.

2. The heat-sink assembly of claim 1, wherein said main heat sink has heat-dissipating fins selected from the group consisting of heat dissipating fins arranged parallel to said support member and said heat dissipating fins arranged perpendicular to said support member.

3. The heat-sink assembly of claim 2, wherein said heat-dissipating fins arranged parallel to said support member comprise a plurality of parallel disks and wherein said heat-dissipating fins perpendicular to said support member comprise a plurality of radial outward projections.

4. The heat-sink assembly of claim 3, further comprising auxiliary heat-dissipating means formed on said base member.

5. The heat-sink assembly of claim 2, wherein said auxiliary heat-dissipating means comprise heat-dissipating fins formed on said base member.

6. The heat-sink assembly of claim 3, further comprising air-flow guiding means attached to said base member.

7. The heat-sink assembly of claim 6, wherein said air-flow guiding means comprises a funnel for directing air flow to said main heat sink.

8. The heat-sink assembly of claim 1, wherein a gap is formed between said heat-dissipating means and said heat source in said heat-exchanging position and wherein said gap is filled with a heat-conducting medium through which said heat exchanging contact between said heat-sink assembly and said heat source is carried out.

9. The heat-sink assembly of claim 8, wherein said heat-conducting medium is selected from a group consisting of a heat-conducting adhesive, heat-conducting epoxy, and heat-conducting tape.

10. The heat-sink assembly of claim 4, wherein a gap is formed between said heat-dissipating means and said heat source in said heat-exchanging position and wherein said gap is filled with a heat-conducting medium through which said heat exchanging contact between said heat-sink assembly and said heat source is carried out.

11. The heat-sink assembly of claim 8, wherein said heat-conducting medium is selected from a group consisting of a heat-conducting adhesive, heat-conducting epoxy, and heat-conducting tape.

12. The heat-sink assembly of claim 4, wherein a gap is formed between said heat-dissipating means and said heat source in said heat-exchanging position and wherein said gap is filled with a heat-conducting medium through which said heat exchanging contact between said heat-sink assembly and said heat source is carried out.

13. The heat-sink assembly of claim 12, wherein said heat-conducting medium is selected from a group consisting of a heat-conducting adhesive, heat-conducting epoxy, and heat-conducting tape.

14. The heat-sink assembly of claim 2, wherein a gap is formed between said heat-dissipating means and said heat source in said heat-exchanging position and wherein said gap is filled with a heat-conducting medium through which said heat exchanging contact between said heat-ink assembly and said heat source is carried out.

15. The heat-sink assembly of claim 14, wherein said heat-conducting medium is selected from a group consisting of a heat-conducting adhesive, heat-conducting epoxy, and heat-conducting tape.

16. The heat-sink assembly of claim 6, wherein a gap is formed between said heat-dissipating means and said heat source in said heat-exchanging position and wherein said gap is filled with a heat-conducting medium through which said heat exchanging contact between said heat-sink assembly and said heat source is carried out.

17. The heat-sink assembly of claim 16, wherein said heat-conducting medium is selected from a group consisting of a heat-conducting adhesive, heat-conducting epoxy, and heat-conducting tape.

18. A heat-sink assembly for removal of heat from an IC chip source with which said heat-sink assembly is maintained in a heat-exchanging contact, comprising:
   a PC board for supporting, at least on one side thereof, said IC chip and said heat-sink assembly, said IC chip having a height;
   said heat-sink assembly comprising:
      a U-shaped base member made of a metal with good heat-conducting properties and having a central part parallel to said IC chip and side members perpendicular to said central part, said central part being raised above said PC board, said side members having lower ends which are located below said central part and being soldered to said,PC board so that a space having a height greater than said height of said IC chip and sufficient to accommodate said IC chip is formed between said PC board and said central part; and
      a main heat sink for removal of heat from said IC chip through said heat-exchanging contact;
      said U-shape base member, said central part, and said side members including said lower ends being made from a single sheet-metal workpiece;
      said base member having a through opening with a periphery in the area above said IC chip and between said side members, said opening having bendable lugs arranged on said periphery, said main heat sink being insertable into said opening by deforming said bendable lugs to a bended position and installing said main heat sink to a heat-exchanging position which provides said heat exchanging contact between said heat-sink assembly and said IC chip, said bendable lugs comprising locking means for locking said main heat sink in said heat-exchanging position.

19. The heat-sink assembly of claim 18, wherein said main heat sink has heat-dissipating fins selected from the group consisting of heat dissipating fins arranged parallel to said PC board and heat dissipating fins arranged perpendicular to said PC board.

20. The heat-sink assembly of claim 19, wherein said heat-dissipating fins arranged parallel to PC board comprise a plurality of parallel disks and wherein said heat-dissipating fins perpendicular to said PC board comprise a plurality of radial outward projections.

21. The heat-sink assembly of claim 20, further comprising auxiliary heat-dissipating means formed on said base member.

22. The heat-sink assembly of claim 21, wherein said auxiliary heat-dissipating means comprise heat-dissipating fins formed on said side members.

23. The heat-sink assembly of claim 21, further comprising air-flow guiding means attached to said base member.

24. The heat-sink assembly of claim 23, wherein said air-flow guiding means comprises a funnel for directing air flow to said main heat sink.

25. The heat-sink assembly of claim 1, wherein a gap is formed between said heat-dissipating means and said heat source in said heat-exchanging position and wherein said gap is filled with a heat-conducting medium through which said heat exchanging contact between said heat-sink assembly and said heat source is carried out.

* * * * *